United States Patent [19]

Wood

[11] Patent Number: 5,211,905
[45] Date of Patent: May 18, 1993

[54] MANUFACTURE OF SINTERED URANIUM DIOXIDE

[75] Inventor: Geoffrey A. Wood, Preston, United Kingdom

[73] Assignee: British Nuclear Fuels plc, Warrington, United Kingdom

[21] Appl. No.: 872,719

[22] Filed: Apr. 17, 1992

[30] Foreign Application Priority Data

Apr. 17, 1991 [GB] United Kingdom ................. 9108189

[51] Int. Cl.$^5$ .............................................. G21C 3/62
[52] U.S. Cl. ..................................... 376/261; 376/421; 264/0.5
[58] Field of Search ............... 376/261, 421, 422, 901; 976/DIG. 96, DIG. 95, DIG.93; 264/0.5; 252/638, 636; 423/261

[56] References Cited

U.S. PATENT DOCUMENTS

| | | | |
|---|---|---|---|
| 4,885,147 | 12/1989 | Murakami et al. | 423/261 |
| 4,965,024 | 10/1990 | Wood | 264/0.5 |
| 5,061,434 | 10/1991 | Wood | 376/261 |

FOREIGN PATENT DOCUMENTS

| | | |
|---|---|---|
| 1352972 | 5/1974 | United Kingdom . |
| 2020641 | 11/1979 | United Kingdom . |
| 2177249 | 1/1987 | United Kingdom . |

OTHER PUBLICATIONS

Abstract No. 91-262469 of JP-A-3170898 issued Jul. 24, 1991, World Patents Index Latest, Derwent Publications Limited, London.

Abstract No. 89-072773 of JP-A-1025093 issued Jan. 27, 1989, World Patents Index Latest, Derwent Publications Limited, London.

Abstract No. 90-358580 of JP-A-2259596 issued Oct. 22, 1990, World Patents Index Latest, Derwent Publications Limited, London.

Primary Examiner—Daniel D. Wasil
Attorney, Agent, or Firm—William R. Hinds

[57] ABSTRACT

A method of manufacturing sintered uranium dioxide in which a mixture is formed of single crystals of uranium dioxide and uranium dioxide powder. Compacts are formed from granules of the mixture, the compacts are sintered in carbon dioxide, and then reduced in a hydrogen environment at a substantially lower temperature than the sintering temperature. The quantity of the single crystals is selected so as to inhibit excessive grain growth in the compacts during sintering.

13 Claims, No Drawings

MANUFACTURE OF SINTERED URANIUM DIOXIDE

This invention relates to the manufacture of sintered uranium dioxide.

It is known that the sintering of uranium dioxide at high temperatures in a carbon dioxide environment usually results in sintered uranium dioxide having excessive grain growth. For example, individual grains can achieve dimensions greater than 1000 microns. As a consequence there are usually only a few grains in the sintered uranium dioxide and these will have nucleated and then grown preferentially at the expense of other grains at some stage during the microstructural development of the sintered uranium dioxide. This produces a population of grains in which a very few grains, which comprise most of the pellet volume, are of excessive size (greater than 1000 microns), and the remaining grains are of relatively small size (around 20 microns). This results in the sintered uranium dioxide having an unstable microstructure which is undesirable for use as a nuclear fuel in a nuclear reactor.

It is an object of the invention to provide a method of manufacturing sintered uranium dioxide having a more uniform microstructure when sintered in a carbon dioxide environment.

According to the present invention there is provided a method of manufacturing sintered uranium dioxide having a substantially uniform microstructure, the method including the steps of forming a mixture of a predetermined quantity of seeds comprising single crystals of uranium dioxide with a powder comprising uranium dioxide, producing granules from the mixture, forming compacts comprising the granules, sintering the compacts at a first temperature in a gaseous environment consisting essentially of carbon dioxide, and then subjecting the compacts to a reducing gaseous environment comprising hydrogen at a substantially lower temperature than the first temperature, the quantity of seeds being such as to stabilise the microstructure of the sintered compacts by inhibiting excessive grain growth in the compacts during said sintering step.

Preferably, the seeds are selected so as to be of a size not exceeding 38 microns, for example in the size ranges: 30–38 microns; 20–30 microns; 10–20 microns; and less than 10 microns.

Advantageously, the seeds are mixed with the powder in a quantity of 2% by weight.

In a preferred form of the invention, the sintering step is performed at a temperature of about 1700° C., and the reducing step is performed at a temperature of about 1150° C., at heating and cooling rates of about 10° C. per minute between ambient and 1700° C. and on cooling from 1700° C. to 1150° C.

The invention further includes sintered uranium dioxide made by the method of the invention and which may be in the form of cylindrical pellets.

The invention will now be further described by way of example only in the following examples:

EXAMPLE I

Seed crystals of uranium dioxide were manufactured by high temperature disintegration of uranium dioxide in dry hydrogen. To achieve this, green pellets of uranium dioxide were heated to 2100° C. for 1 hour using heating and cooling rates controlled at 20° C. per minute. The seeds obtained were sieved to obtain seeds of a selected size range—30–38 microns. The seeds were mixed with uranium dioxide powder at a quantity of 2% by weight and the mixture homogenised by multiple sieving through a 106 micron sieve. The homogenised mixture was granulated and pelleted, after which the pellets were pressed at a pressure of 4 tonnes per square centimetre to produce green pellets. The green pellets were sintered for 5 hours in flowing carbon dioxide at 1700° C. followed by reduction at 1150° C. in hydrogen for 1 hour before being allowed to cool to room temperature. The heating and cooling rates between room temperature and 1700° C. and on cooling to 1150° C. were controlled at 10° C. per minute. Samples of the sintered pellets were ceramographically prepared and analysed to determine the grain size. The results showed the average grain size in the pellets to be around 45.5 microns with a generally uniform microstructure.

EXAMPLE II

The method was repeated as in Example I except that seeds of a size range 20–30 microns were selected. Analysis of the sintered pellets showed the average grain size to be around 42.1 microns.

EXAMPLE III

The method was repeated as in Example I except that seeds of a size range 10–20 microns were selected. Analysis of the sintered pellets showed the average grain size to be around 40.2 microns.

EXAMPLE IV

The method was repeated as in Example I except that seeds of a size less than 10 microns were selected. Analysis of the sintered pellets shows the average grain size to be around 32.3 microns.

In each of the above EXAMPLES relatively large grain sizes were produced but in a substantially uniform microstructure. By contrast, when the method was performed on unseeded uranium dioxide pellets, this resulted in excessive grain growth with some grain sizes of at least 1000 microns, and areas of the pellets containing small grains of size around 20 microns.

One of the advantages of the invention is that the method enables uranium dioxide pellets to be sintered in carbon dioxide without uncontrolled grain growth in the pellets.

Another advantage is that the method takes place in the solid state in the absence of a liquid phase of the seeds or the powder.

Yet a further advantage is that use of the method enables sintered uranium dioxide pellets to be produced having grain sizes which enhance fission gas retention when used as nuclear fuel pellets in nuclear power reactors.

Although the invention has been described in relation to the use of about 2% by weight of the seeds, other quantities may be used for particular purposes.

I claim:

1. A method of manufacturing sintered uranium dioxide pellets having a substantially uniform microstructure, the method including the steps of forming a mixture of a predetermined quantity of seeds comprising single crystals of uranium dioxide with a powder comprising uranium dioxide, producing granules from the mixture, forming compacts comprising the granules, sintering the compacts at a first temperature in a gaseous environment consisting essentially of carbon dioxide, and then subjecting the compacts to a reducing gaseous environment comprising hydrogen at a substantially lower temperature than the first temperature, the quantity of seeds being such, and the size range of the seeds being restricted so, as to stabilise the microstructure of the sintered compacts by inhibiting excessive grain growth in the compacts during said sintering step.

2. A method of manufacturing sintered uranium dioxide pellets having a substantially uniform microstructure, the method including the steps of forming a mixture of a predetermined quantity of seeds comprising single crystals of uranium dioxide with a powder comprising uranium dioxide, producing granules from the mixture, forming compacts comprising the granules, sintering the compacts at a first temperature in a gaseous environment consisting essentially of carbon dioxide, and then subjecting the compacts to a reducing gaseous environment comprising hydrogen at a substantially lower temperature than the first temperature, the quantity of seeds being such as to stabilise the microstructure of the sintered compacts by inhibiting excessive grain growth in the compacts during said sintering step, the sintering step being performed at a temperature of about 1700° C., and the reducing step being performed at a temperature of about 1150° C., at heating and cooling rates of about 10° C. per minute between ambient and 1700° C. and on cooling from 1700° C. to 1150° C.

3. A method as claimed in claim 2, wherein the sintering step is performed for about 5 hours, and the reducing step is performed for about 1 hour.

4. A method as claimed in claim 2, wherein the seeds are of a size not exceeding 38 microns.

5. A method as claimed in claim 4, wherein the seeds are of a size less than 10 microns.

6. A method as claimed in claim 4, wherein the seeds are of a size between 10 and 20 microns.

7. A method as claimed in claim 4, wherein the seeds are of a size between 20 and 30 microns.

8. A method as claimed in claim 4, wherein the seeds are of a size between 30 and 38 microns.

9. A method as claimed in claim 4, wherein the seeds are mixed with the powder in a quantity of about 2% by weight.

10. A method as claimed in claim 4, wherein the compacts are of cylindrical form.

11. A method for the manufacture of sintered uranium dioxide pellets having a substantially uniform microstructure, the method comprising:
    (a) manufacturing a preselected quantity of seeds comprising single crystals of uranium dioxide of a size not exceeding 38 microns;
    (b) mixing the seeds in a quantity of about 2% by weight with a powder comprising uranium dioxide and homogenising the mixture;
    (c) granulating and pelleting the mixture;
    (d) pressing the resultant pellets;
    (e) sintering the pellets in a gaseous environment consisting essentially of carbon dioxide for a period of about 5 hours at a temperature of about 1700° C. at a heating rate between ambient and said 1700° C. of about 10° C. per minute, and
    (f) subjecting the sintered pellets for a period of about 1 hour to a reducing gaseous environment comprising hydrogen at a temperature of about 1150° C. at a cooling rate between said 1700° and 1150° C. of about 10° C. per minute.

12. A method as claimed in claim 1, wherein the size range between the largest and the smallest seeds is about 10 microns.

13. A method as claimed in claim 12, wherein the largest seed does not exceed 38 microns.

* * * * *